United States Patent
Takahashi et al.

(10) Patent No.: US 11,253,928 B2
(45) Date of Patent: Feb. 22, 2022

(54) COATED CUTTING TOOL

(71) Applicant: TUNGALOY CORPORATION, Fukushima (JP)

(72) Inventors: Kinya Takahashi, Iwaki (JP); Naoyuki Fukushima, Iwaki (JP)

(73) Assignee: TUNGALOY CORPORATION, Iwaki (JP)

( * ) Notice: Subject to any disclaimer, the term of this patent is extended or adjusted under 35 U.S.C. 154(b) by 50 days.

(21) Appl. No.: 16/850,796

(22) Filed: Apr. 16, 2020

(65) Prior Publication Data

US 2020/0361003 A1    Nov. 19, 2020

(30) Foreign Application Priority Data

May 14, 2019 (JP) .............................. JP2019-091437

(51) Int. Cl.
| | |
|---|---|
| B23B 27/14 | (2006.01) |
| C23C 16/36 | (2006.01) |
| C23C 16/40 | (2006.01) |
| B23C 5/16 | (2006.01) |

(52) U.S. Cl.
CPC .............. B23B 27/148 (2013.01); B23C 5/16 (2013.01); C23C 16/36 (2013.01); C23C 16/403 (2013.01); *B23B 2228/105* (2013.01)

(58) Field of Classification Search
CPC . B23B 27/14; B23B 27/148; B23B 2228/105; C23C 16/308; C23C 16/32; C23C 16/34; C23C 16/36; C23C 16/403; C23C 16/044
USPC ............................................. 428/698
See application file for complete search history.

(56) References Cited

U.S. PATENT DOCUMENTS

| | | | | |
|---|---|---|---|---|
| 4,357,382 A | * | 11/1982 | Lambert | ............... C23C 30/005 |
| | | | | 428/212 |
| 10,974,324 B2 | * | 4/2021 | Takahashi | ............. B23B 27/148 |
| 2003/0022029 A1 | * | 1/2003 | Kidama | ................ C23C 30/005 |
| | | | | 428/701 |
| 2004/0202877 A1 | * | 10/2004 | Martensson | ............. C04B 41/89 |
| | | | | 428/469 |
| 2014/0377024 A1 | | 12/2014 | Sobana et al. | |
| 2017/0342554 A1 | * | 11/2017 | Bjormander | .......... C23C 28/048 |

FOREIGN PATENT DOCUMENTS

| JP | 2002-346811 | * | 12/2002 |
|---|---|---|---|
| JP | 2013132717 A | | 7/2013 |

* cited by examiner

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate, wherein the coating layer includes a predetermined lower layer, an intermediate layer comprising $\alpha\text{-}Al_2O_3$, and an upper layer comprising TiCN; the lower layer, intermediate layer, and upper layer have predetermined average thicknesses; a condition represented by formula (1) [RSA≥40 (1)] is satisfied; the interface of the intermediate layer on the upper layer side has a kurtosis roughness ($S_{ku}$) of more than 3.0; the interface of the intermediate layer on the upper layer side has a skewness roughness ($S_{sk}$) of less than 0; and a condition represented by formula (2) [RSB≥40 (2)] is satisfied.

20 Claims, 1 Drawing Sheet

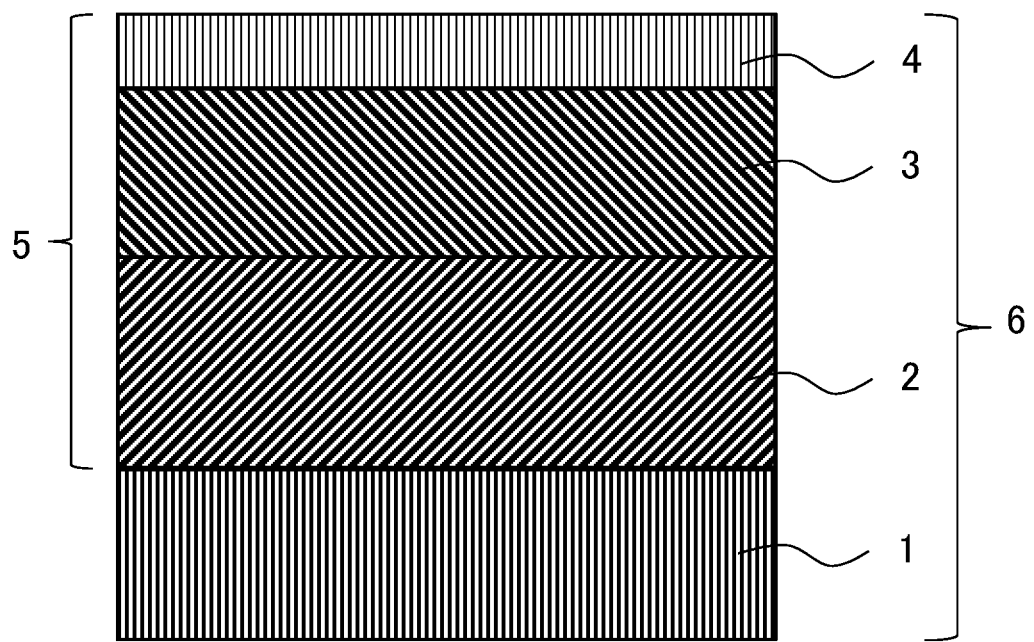

COATED CUTTING TOOL

TECHNICAL FIELD

The present invention relates to a coated cutting tool.

BACKGROUND ART

It is well known that conventional coated cutting tools used for the cutting of steel, cast iron, and the like, is a coated cutting tool which is obtained by depositing, via chemical vapor deposition on a surface of a substrate consisting of a cemented carbide, a coating layer with a total thickness of from 3 μm or more to 20 μm or less. A known example of the above coating layer is a coating layer consisting of a single layer of one kind selected from the group consisting of Ti carbide, nitride, carbide nitride, carbide oxide and carbide nitride oxide, and aluminum oxide ($Al_2O_3$) or consisting of multiple layers of two or more kinds selected therefrom.

Japanese Patent Application Laid-Open No. 2013-132717 discloses a surface-coated cutting tool in which a lower layer consisting of a titanium compound layer and an upper layer consisting of an aluminum oxide layer ($Al_2O_3$ layer) are formed by vapor deposition as a hard coating layer on the surface of a tool configured of a tungsten carbide-based cemented carbide, wherein the upper layer consisting of an aluminum oxide layer ($Al_2O_3$ layer) has an orientation coefficient of the (006) orientation, TC(006), of 1.8 or more, and has a ratio I(104)/I(110) of a peak intensity I(104) of a (104) orientation and a peak intensity I(110) of a (110) orientation of 0.5 to 2.0, and the absolute value of a residual stress value in the aluminum oxide layer ($Al_2O_3$ layer) is 100 MPa or less.

SUMMARY

Technical Problem

An increase in speed, feed and depth of cut has become more conspicuous in cutting in recent times, and the wear resistance of a tool and the fracture resistance thereof are required to be further improved compared to those involved in the prior art. In particular, in recent years, there has been an increase in the number of cutting operations in which a load is applied to a coated cutting tool, such as high-speed cutting of steel, and under such severe cutting conditions, crater wear and fracture occur in the conventional tools due to falling of grains of the coating layer, which makes it impossible to extend the tool life.

The effect demonstrated in Japanese Patent Application Laid-Open No. 2013-132717 is that crater wear is suppressed due to the presence of the aluminum oxide layer oriented in the (006) orientation. Meanwhile, in the processing of a work material having a low hardness, the wear of the flank surface on the aluminum oxide layer progresses quickly, and the tool life may be insufficient.

Therefore, an object of the present invention is to provide a coated cutting tool which has excellent wear resistance and fracture resistance and which accordingly allows for an extended tool life.

Solution to Problem

As a result of intensive studies, the present inventors have developed a coated cutting tool including a coating layer including a predetermined lower layer, an intermediate layer comprising $\alpha$-$Al_2O_3$, and an upper layer containing TiCN, wherein, in particular, the intermediate layer has a below-described RSA within a predetermined range, and also a kurtosis roughness ($S_{ku}$) within a predetermined range and a skewness roughness ($S_{sk}$) within a predetermined range, and further the upper layer has a below-described RSB within a predetermined range. It was found that with such a coated cutting tool, wear resistance can be improved and fracture resistance can be also improved by suppressing the falling of grains, and which accordingly allows for an extended tool life.

That is, the present invention is as follows.

[1] A coated cutting tool including a substrate and a coating layer formed on a surface of the substrate, wherein the coating layer includes a lower layer including one or more Ti compound layers containing a Ti compound of Ti and an element of at least one kind selected from the group consisting of C, N, O, and B; an intermediate layer containing $\alpha$-$Al_2O_3$; and an upper layer containing TiCN;

the layers are laminated in this order from the substrate surface side toward a surface side of the coating layer;

the lower layer has an average thickness of 2.0 μm or more and 12.0 μm or less;

the intermediate layer has an average thickness of 3.0 μm or more and 10.0 μm or less;

a first cross section located up to 1 μm from an interface of the intermediate layer on the upper layer side toward the substrate side and parallel to an interface between the substrate and the lower layer satisfies a condition represented by following formula (1), $$RSA \geq 40 \quad (1)$$

in the formula, RSA is a ratio, in terms of area %, of a cross-sectional area of a grains having an orientation difference A of 0 degrees or more and less than 10 degrees to a cross-sectional area of grains having an orientation difference A of 0 degrees or more and 45 degrees or less in the first cross section, and the orientation difference A is an angle, in terms of degrees, between a normal to the first cross section and a normal to a (001) orientation of a grain of the $\alpha$-$Al_2O_3$ in the intermediate layer);

the interface of the intermediate layer on the upper layer side has a kurtosis roughness ($S_{ku}$) of more than 3.0;

the interface of the intermediate layer on the upper layer side has a skewness roughness ($S_{sk}$) of less than 0;

the upper layer has an average thickness of 1.0 μm or more and 9.0 μm or less; and a second cross section located up to 1 μm from the interface of the upper layer on the intermediate layer side toward the interface on the opposite side and parallel to the interface between the substrate and the lower layer satisfies a condition represented by following formula (2), $$RSB \geq 40 \quad (2)$$

in the formula, RSB is a ratio, in terms of area %, of a cross-sectional area of grains having an orientation difference B of 0 degrees or more and less than 10 degrees to a cross-sectional area of grains having an orientation difference B of 0 degrees or more and 45 degrees or less in the second cross section, and the orientation difference B is an angle, in terms of degrees, between a normal to the second cross section and a normal to a (111) orientation of a grain of the TiCN in the upper layer.

[2] The coated cutting tool according to [1], wherein the kurtosis roughness ($S_{ku}$) is more than 3.0 and 10.0 or less.

[3] The coated cutting tool according to [1] or [2], wherein the skewness roughness ($S_{sk}$) is −3.0 or more and less than 0.

[4] The coated cutting tool according to any one of [1] to [3], wherein the first cross section satisfies a condition represented by following formula (1-1), $$RSA \geq 50 \qquad (1\text{-}1)$$

in the formula, RSA is as defined in the formula (1).

[5] The coated cutting tool according to any one of [1] to [4], wherein the second cross section satisfies a condition represented by following formula (2-1), $$RSB \geq 50 \qquad (2\text{-}1)$$

in the formula, RSB is as defined in the formula (2).

[6] The coated cutting tool according to any one of [1] to [5], wherein the average thickness of the entire coating layer is 8.0 μm or more and 30.0 μm or less.

[7] The coated cutting tool according to any one of [1] to [6], wherein the Ti compound layer is at least one selected from the group consisting of a TiN layer, a TiC layer, a TiCN layer, a TiCNO layer, a TiCO layer, a TiON layer, and a $TiB_2$ layer.

[8] The coated cutting tool according to any one of [1] to [7], wherein the substrate is a cemented carbide, a cermet, a ceramic, or a cubic boron nitride sintered body.

Advantageous Effects of Invention

The present invention can provide a coated cutting tool which has excellent wear resistance and fracture resistance and which accordingly allows for an extended tool life.

BRIEF DESCRIPTION OF DRAWINGS

The FIGURE is a schematic cross-sectional view showing an example of a coated cutting tool according to the present embodiment.

DESCRIPTION OF EMBODIMENTS

An embodiment for carrying out the present invention (hereinafter, simply referred to as the "present embodiment") will hereinafter be described in detail with reference to the attached drawings as appropriate, but the present invention is not limited to the following present embodiment. Various modifications may be made to the present invention without departing from the gist of the invention. In addition, in the drawings, unless otherwise specified, positional relationships, such as vertical and horizontal relationships, are presumed to be based on the positional relationships shown in the drawings. Further, the dimensional ratios of the drawings are not limited to those shown therein.

Cutting Tool

The coated cutting tool of the present embodiment includes a substrate and a coating layer formed on the surface of the substrate.

The coating layer in the coated cutting tool of the present embodiment includes a lower layer comprising one or more Ti compound layers containing a Ti compound of Ti and an element of at least one kind selected from the group consisting of C, N, O, and B; an intermediate layer containing $\alpha\text{-}Al_2O_3$; and an upper layer containing TiCN;

the layers are laminated in this order from the substrate surface side toward a surface side of the coating layer;

the lower layer has an average thickness of 2.0 μm or more and 12.0 μm or less; and the intermediate layer has an average thickness of 3.0 μm or more and 10.0 μm or less.

A first cross section located up to 1 μm from an interface of the intermediate layer on the upper layer side toward the substrate side and parallel to an interface between the substrate and the lower layer satisfies a condition represented by the following formula (1), $$RSA \geq 40 \qquad (1)$$

in the formula, RSA is a ratio, in terms of area %, of a cross-sectional area of grains having an orientation difference A of 0 degrees or more and less than 10 degrees to a cross-sectional area of grains having an orientation difference A of 0 degrees or more and 45 degrees or less in the first cross section, the orientation difference A is an angle, in terms of degrees, between a normal to the first cross section and a normal to a (001) orientation of a grain of the $\alpha\text{-}Al_2O_3$ in the intermediate layer.

The interface of the intermediate layer on the upper layer side has a kurtosis roughness ($S_{ku}$) of more than 3.0 and a skewness roughness ($S_{sk}$) of less than 0.

The upper layer has an average thickness of 1.0 μm or more and 9.0 μm or less.

A second cross section located up to 1 μm from the interface of the upper layer on the intermediate layer side toward the interface on the opposite side and parallel to the interface between the substrate and the lower layer satisfies a condition represented by the following formula (2), $$RSB \geq 40 \qquad (2)$$

in the formula, RSB is a ratio, in terms of area %, of a cross-sectional area of grains having an orientation difference B of 0 degrees or more and less than 10 degrees to a cross-sectional area of grains having an orientation difference B of 0 degrees or more and 45 degrees or less in the second cross section, the orientation difference B is an angle, in terms of degrees, between a normal to the second cross section and a normal to a (111) orientation of a grain of the TiCN in the upper layer).

With the above configuration, the coated cutting tool of the present embodiment has excellent wear resistance and fracture resistance, whereby the tool life can be extended.

The factors for the improvements in wear resistance and fracture resistance of the coated cutting tool of the present embodiment can be considered to be set forth as follows. However, the present invention is not in any way limited by the factors set forth below.

Since the intermediate layer having the above-described RSA within a predetermined range and containing $\alpha\text{-}Al_2O_3$ oriented in (001) is provided, a grain of the $\alpha\text{-}Al_2O_3$ grain is unlikely to falling and excellent wear resistance is achieved. However, under conditions where a soft work material is machined at a high speed, the flank surface wear progresses rapidly which may make it impossible to extend the tool life. Therefore, it is considered that where the upper layer having the above-described RSB within a predetermined range and containing TiCN oriented in the (111) orientation is provided on the surface side of the coating layer with reference to the intermediate layer, since the hardness of the upper layer is high, the wear of the flank surface can be suppressed. However, even when the upper layer is formed, in the high-speed processing of a soft work material, the adhesion between the intermediate layer and the upper layer may be insufficient, and the effect of suppressing the wear of the flank surface by the upper layer may not last. Accordingly, in the present embodiment, the interface of the intermediate layer containing $\alpha\text{-}Al_2O_3$ on the upper layer side has a kurtosis roughness ($S_{ku}$) of more than 3.0 and also has a skewness roughness ($S_{sk}$) of less than 0, thereby improving the adhesion, and it is considered that as a result, the effect of the TiCN layer oriented in the (111) orientation can be extended, and the tool life can be extended.

The FIGURE is a schematic cross-sectional view showing an example of the coated cutting tool of the present embodiment. A coated cutting tool 6 is provided with a substrate 1 and a coating layer 5 located on a surface of the substrate 1, and a lower layer 2, an intermediate layer 3 and an upper layer 4 are laminated in this order from the substrate side in an upward direction in the coating layer 5.

The coated cutting tool according to the present embodiment includes a substrate and a coating layer formed on a surface of the substrate. Specific examples of types of the coated cutting tool include an indexable cutting insert for milling or turning, a drill and an end mill.

The substrate used in the present embodiment is not particularly limited, as long as it may be used as a substrate for a coated cutting tool. Examples of such substrate include a cemented carbide, cermet, ceramic, a cubic boron nitride sintered body, a diamond sintered body and high-speed steel. From among the above examples, the substrate is preferably comprised of a cemented carbide, cermet, ceramic or a cubic boron nitride sintered body as this provides further excellent wear resistance and fracture resistance, and, from the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided even if the substrate surface has been modified in this way.

The coating layer in the present embodiment has an average thickness of 8.0 μm or more and 30.0 μm or less. Where the average thickness of the coating layer is 8.0 μm or more, the wear resistance is improved, and where the average thickness of the coating layer is 30.0 μm or less, the adhesion and fracture resistance of the coating layer to the substrate are improved. From the same viewpoint, the average thickness of the coating layer is more preferably 10.0 μm or more and 27.0 μm or less, further preferably 12.7 μm or more and 24.5 μm or less. The average thickness of each layer and the entire coating layer in the coated cutting tool of the present embodiment can be obtained by measuring the thickness of each layer or the thickness of the entire coating layer from cross sections in three or more locations of each layer or the entire coating layer and calculating the arithmetic mean value.

Lower Layer

The lower layer in the present embodiment includes one or more Ti compound layers containing a Ti compound of Ti and an element of at least one kind selected from the group consisting of C, N, O and B. Where the coated cutting tool includes the lower layer between the substrate and the intermediate layer containing α-aluminum oxide (α-$Al_2O_3$), wear resistance and adhesion are improved.

Examples of the Ti compound layer include a TiC layer containing TiC, a TiN layer containing TiN, a TiCN layer containing TiCN, a TiCO layer containing TiCO, a TiCNO layer containing TiCNO, a TiON layer containing TiON, and a $TiB_2$ layer containing $TiB_2$.

The lower layer may be configured of a single layer or multiple layers (for example, two or three layers), but is configured preferably of multiple layers, more preferable of two or three layers, and still more preferable of three layers. From the viewpoint of further improving the wear resistance and adhesion, the lower layer preferably includes at least one layer selected from the group consisting of a TiN layer, a TiC layer, a TiCN layer, a TiCNO layer, a TiCO layer, a TiON layer, and a $TiB_2$ layer, and more preferably includes at least one layer selected from the group consisting of a TiN layer, a TiC layer, a TiCN layer, a TiCNO layer, and a TiCO layer, and it is also preferable that at least one of the lower layers be a TiCN layer because the wear resistance is further improved. Where the lower layer is configured of three layers, a TiC layer or a TiN layer may be formed as a first layer on the surface of the substrate, a TiCN layer may be formed as a second layer on the surface of the first layer, and a TiCNO layer or a TiCO layer may be formed as a third layer on the surface of the second layer. Among them, the TiN layer may be formed as the first layer on the surface of the substrate, the TiCN layer may be formed as the second layer on the surface of the first layer, and the TiCNO layer may be formed as the third layer on the surface of the second layer.

The overall average thickness of the lower layer in the present embodiment is preferably 2.0 μm or more and 12.0 μm or less. Where the average thickness of the lower layer is 2.0 μm or more, the wear resistance is improved. Meanwhile, where the average thickness of the lower layer is 12.0 μm or less, the fracture resistance is improved mainly due to suppression of peeling of the coating layer. From the same viewpoint, the average thickness of the lower layer is more preferably 3.0 μm or more and 12.0 μm or less, even more preferably 4.0 μm or more and 12.0 μm or less, and particularly preferably 4.5 μm or more and 11.5 μm or less.

From the viewpoint of further improving the wear resistance and fracture resistance, the average thickness of the TiC layer or TiN layer is preferably 0.05 μm or more and 1.0 μm or less. From the same viewpoint, the average thickness of the TiC layer or the TiN layer is more preferably 0.10 μm or more and 0.50 μm or less, and even more preferably 0.15 μm or more and 0.30 μm or less.

From the viewpoint of further improving the wear resistance and fracture resistance, the average thickness of the TiCN layer is preferably 1.5 μm or more and 11.8 μm or less. From the same viewpoint, the average thickness of the TiCN layer is more preferably 2.5 μm or more and 11.5 μm or less, and even more preferably 3.5 μm or more and 11.0 μm or less.

From the viewpoint of further improving the wear resistance and fracture resistance, the average thickness of the TiCNO layer or the TiCO layer is preferably 0.1 μm or more and 1.0 μm or less. From the same viewpoint, the average thickness of the TiCNO layer or the TiCO layer is more preferably 0.2 μm or more and 0.5 μm or less.

The Ti compound layer contains a Ti compound of Ti and an element of at least one kind selected from the group consisting of C, N, O and B, but may contain trace amounts of other elements as long as the operational effect of the lower layer is exhibited.

Intermediate Layer

The intermediate layer in the present embodiment contains α-$Al_2O_3$. The intermediate layer preferably consists of α-aluminum oxide (α-$Al_2O_3$), but may or may not contain components other than α-aluminum oxide (α-$Al_2O_3$) as the operational effect of the present invention is exhibited.

RSA

In the intermediate layer in the present embodiment, a first cross section located up to 1 µm from the interface of the intermediate layer on the upper layer side toward the substrate side and parallel to the interface between the substrate and the lower layer satisfies a condition represented by the following formula (1).

$$RSA \geq 40 \quad (1)$$

In the formula, RSA is a ratio (unit: area %) of a cross-sectional area of grains having an orientation difference A of 0 degrees or more and less than 10 degrees to a cross-sectional area of grains having an orientation difference A of 0 degrees or more and 45 degrees or less in the first cross section, the orientation difference A is an angle (unit: degree) between a normal to the first cross section and a normal to a (001) orientation of a grain of the $\alpha$-$Al_2O_3$ in the intermediate layer.

In the coated cutting tool of the present embodiment, the falling of the grain of the $\alpha$-$Al_2O_3$ is prevented, excellent crater wear resistance is achieved, and therefore wear resistance can be improved mainly due to the increase in heat resistance of the intermediate layer resulting from RSA being 40 area % or more. From the same viewpoint, RSA is preferably 50 area % or more, and more preferably 60 area % or more. The upper limit of the RSA is not particularly limited, but is, for example, 80 area % or less. RSA can be determined by the method described in Examples.

Kurtosis Roughness ($S_{ku}$)

In the present embodiment, the interface of the intermediate layer on the upper layer side has a kurtosis roughness ($S_{ku}$) of more than 3.0. Here, the kurtosis roughness ($S_{ku}$) is stipulated by ISO 25178, and means an average quartic value of Z(x, y) on a reference plane that is made dimensionless by taking the fourth power of a root mean square height Sq. The kurtosis roughness ($S_{ku}$) means kurtosis, which is a measure of the sharpness of the surface, and is an index representing the peakedness (sharpness) of the height distribution. The kurtosis roughness ($S_{ku}$) of the surface (upper layer side) of the intermediate layer being more than 3.0 indicates that the surface texture has sharp irregularities, and as a result, the anchor effect is increased which is presumed to improve the adhesion to the upper layer. Further, since the TiCN of the upper layer, which will be described later, is more likely to be attached to the uneven portion than the flat portion, it is presumed that the pores at the interface between the intermediate layer and the upper layer are reduced, thereby improving the adhesion to the upper layer.

From the same viewpoint, the kurtosis roughness ($S_{ku}$) of the interface of the intermediate layer on the upper layer side is preferably 3.5 or more, more preferably 4.0 or more, and even more preferably 4.5 or more. The upper limit of the kurtosis roughness ($S_{ku}$) is not particularly limited, but is, for example, preferably 15.0 or less, and more preferably 11.6 or less. The kurtosis roughness ($S_{ku}$) can be determined by the method described in Examples.

Regarding the kurtosis roughness ($S_{ku}$) of the interface of the intermediate layer on the upper layer side, the kurtosis roughness ($S_{ku}$) can be increased and set within the above-described range, for example, by reducing the amount of $AlCl_3$ in the raw material composition in the below-described roughness control step with respect to that in the film formation step.

Skewness Roughness ($S_{sk}$)

The interface of the intermediate layer on the upper layer side has a skewness roughness ($S_{sk}$) of less than 0. The skewness roughness ($S_{sk}$) is stipulated by ISO 25178, and means a mean cube value of Z(x, y) on a reference plane that is made dimensionless by taking the third power of the root mean square height Sq. The skewness roughness ($S_{sk}$) means skewness, and is an index indicating the symmetry of a peak and a valley around an average plane. The skewness roughness ($S_{sk}$) being smaller than 0 indicates upward deviation with respect to the average line of the surface roughness of the intermediate layer. The average line of the surface roughness of the intermediate layer is synonymous with the average line of the roughness of the interface between the intermediate layer and the upper layer. In other words, upward deviation with respect to the average line of the surface roughness of the intermediate layer indicates that the ratio of $\alpha$-$Al_2O_3$ is greater than the ratio of TiCN at the average line of the roughness of the interface between the intermediate layer and the upper layer. Generally, the fracture toughness value of $\alpha$-$Al_2O_3$ is smaller than that of TiCN, and $\alpha$-$Al_2O_3$ is more easily cracked than TiCN for crystals of the same thickness. Accordingly, since the ratio of the $\alpha$-$Al_2O_3$, which is easily cracked, is made larger than that of TiCN at the average line of the roughness of the interface between the $\alpha$-$Al_2O_3$ layer and the TiCN layer, peeling of the upper layer due to the cracking of the $\alpha$-$Al_2O_3$ layer can be suppressed. It is presumed that as a result of obtaining a large ratio of the $\alpha$-$Al_2O_3$, which is easily cracked, fracture starting points are unlikely to appear and the occurrence of peeling is suppressed.

From the same viewpoint, the skewness roughness ($S_{sk}$) of the interface of the intermediate layer on the upper layer side is preferably −0.2 or less, more preferably −0.3 or less, and even more preferably −0.4 or less. The lower limit of the skewness roughness ($S_{sk}$) is not particularly limited, but is preferably, for example, −3.0 or more, and more preferably −2.6 or more. The skewness roughness ($S_{sk}$) can be determined by the method described in Examples.

Regarding the skewness roughness ($S_{sk}$) of the interface of the intermediate layer on the upper layer side, the skewness roughness ($S_{sk}$) can be decreased and set within the above-described range, for example, by reducing the amount of $AlCl_3$ in the raw material composition in the below-described roughness control step with respect to that in the film formation step.

The intermediate layer in the present embodiment has an average thickness of 3.0 µm or more and 10.0 µm or less. Where the average thickness of the intermediate layer is 3.0 µm or more, the wear resistance of the rake surface of the coated cutting tool is further improved, and where the average thickness is 10.0 µm or less, peeling of the coating layer is further suppressed, and the fracture resistance of the coated cutting tool is further improved. From the same viewpoint, the intermediate layer has a thickness preferably of 4.0 µm or more and 10.0 µm or less, more preferably 5.0 µm or more and 10.0 µm or less, and even more preferably 6.0 µm or more and 9.7 µm or less.

Upper Layer

The upper layer in the present embodiment contains TiCN. The upper layer preferably consists of TiCN, but may or may not contain components other than TiCN as long as the operational effect of the present invention is achieved. The upper layer is preferably adjacent to the intermediate layer.

In the present embodiment, a second cross section located up to 1 µm from the interface of the upper layer on the intermediate layer side toward the interface on the opposite side and parallel to the interface between the substrate and the lower layer satisfies a condition represented by the following formula (2).

$$RSB \geq 40 \qquad (2)$$

In the formula, RSB is a ratio (unit: area %) of a cross-sectional area of grains having an orientation difference B of 0 degrees or more and less than 10 degrees to a cross-sectional area of grains having an orientation difference B of 0 degrees or more and 45 degrees or less in the second cross section, the orientation difference B is an angle (unit: degree) between a normal to the second cross section and a normal to a (111) orientation of a grain of the TiCN in the upper layer.

In the coated cutting tool of the present embodiment, as a result of the RSB being 40 area % or more, the falling of the grain of the $\alpha$-$Al_2O_3$ from the intermediate layer can be suppressed, so that the wear resistance and fracture resistance are improved. Where the upper layer containing a large amount of TiCN oriented in the (111) orientation, which is harder than other orientations, is provided on the surface side of the coating layer with reference to the intermediate layer, wear on the flank surface can be suppressed. From the same viewpoint, RSB is preferably 50 area % or more, more preferably 60 area % or more. The upper limit of RSB is not particularly limited, but is, for example, 70 area % or less.

RSB can be obtained by the method described in Examples.

The average thickness of the upper layer in the present embodiment is 1.0 μm or more and 9.0 μm or less. Where the average thickness of the upper layer is 1.0 μm or more, the effect of suppressing the falling of grains of the $\alpha$-$Al_2O_3$ layer tends to be further improved, and where the average thickness of the upper layer is 9.0 μm or less, the fracture resistance tends to be further improved. From the same viewpoint, the average thickness of the upper layer is preferably 1.5 μm or more and 8.0 μm or less, and more preferably 3.0 μm or more and 6.0 μm or less.

Method for Manufacturing Cutting Tool

As a method for forming each layer constituting the coating layer in the coated cutting tool of the present embodiment, for example, the following methods can be mentioned. However, the methods for forming the layers are not limited to these methods.

For example, a Ti compound layer, being included of a Ti nitride layer (hereinafter also referred to as a "TiN layer") can be formed by chemical vapor deposition at a temperature of 850° C. to 950° C. and a pressure of 300 hPa to 400 hPa by using a raw material composition of $TiCl_4$: 5.0 mol % to 10.0 mol %, $N_2$: 20 mol % to 60 mol %, and $H_2$: balance.

A Ti compound layer, being included of a Ti carbide layer (hereinafter also referred to as "TiC layer") can be formed by chemical vapor deposition at a temperature of 950° C. to 1050° C. and a pressure of 70 hPa to 80 hPa by using a raw material composition of $TiCl_4$: 1.5 mol % to 3.5 mol %, $CH_4$: 3.5 mol % to 5.5 mol %, and $H_2$: balance.

A Ti compound layer, being included of a Ti carbide nitride layer (hereinafter also referred to as "TiCN layer") can be formed by chemical vapor deposition at a temperature of 800° C. to 900° C. and a pressure of 60 hPa to 80 hPa by using a raw material composition of $TiCl_4$: 5.0 mol % to 7.0 mol %, $CH_3CN$: 0.5 mol % to 1.5 mol %, and $H_2$: balance.

A Ti compound layer, being included of a Ti carbide nitride oxide layer (hereinafter also referred to as "TiCNO layer") can be formed by chemical vapor deposition at a temperature of 950° C. to 1050° C. and a pressure of 50 hPa to 150 hPa by using a raw material composition of $TiCl_4$: 3.0 mol % to 4.0 mol %, CO: 0.5 mol % to 1.0 mol %, $N_2$: 30 mol % to 40 mol %, and $H_2$: balance.

A Ti compound layer, being included of a Ti carbide oxide layer (hereinafter also referred to as "TiCO layer") can be formed by chemical vapor deposition at a temperature of 950° C. to 1050° C. and a pressure of 50 hPa to 150 hPa by using a raw material composition of $TiCl_4$: 1.0 mol % to 2.0 mol %, CO: 2.0 mol % to 3.0 mol %, and $H_2$: balance.

A lower layer, being included one or more Ti compound layers is formed on the surface of the substrate. Next, the surface of the layer farthest from the substrate is oxidized. More specifically, the oxidation of the surface of the layer farthest from the substrate is performed under the conditions of a temperature of 950° C. to 1050° C. and a pressure of 50 hPa to 60 hPa by setting the gas composition to CO: 0.1 mol % to 0.3 mol %, $CO_2$: 0.3 mol % to 1.0 mol %, and $H_2$: balance (oxidation step). The oxidation treatment time at this time is preferably 1 min to 3 min.

For example, after the above-described oxidation step, nuclei of $\alpha$-$Al_2O_3$ are formed on the surface of the layer farthest from the substrate (nucleation step), and the intermediate layer containing $\alpha$-$Al_2O_3$ is formed in a state where the nuclei have been formed (film formation step). Further, in order to obtain the above-described kurtosis roughness ($S_{ku}$) and skewness roughness ($S_{sk}$), a step of controlling the surface roughness of the intermediate layer (roughness control step) may be provided.

The nuclei of the intermediate layer are formed by chemical vapor deposition at a temperature of 880° C. to 930° C. and a pressure of 60 hPa to 80 hPa by using a raw material gas composition of $AlCl_3$: 1.0 mol % to 4.0 mol %, CO: 0.05 mol % to 2.0 mol %, $CO_2$: 1.0 mol % to 3.0 mol %, HCl: 2.0 mol % to 3.0 mol %, and $H_2$: balance (nucleation step).

Further, the intermediate layer is formed by chemical vapor deposition at a temperature of 950° C. to 1000° C. and a pressure of 60 hPa to 80 hPa by using a raw material gas composition of $AlCl_3$: 2.0 mol % to 5.0 mol %, $CO_2$: 2.5 mol % to 4.0 mol %, HCl: 2.0 mol % to 3.0 mol %, $H_2S$: 0.15 mol % to 0.25 mol %, and $H_2$: balance (film formation step).

Further, the surface roughness of the intermediate layer is controlled by chemical vapor deposition at a temperature of 950° C. to 1000° C. and a pressure of 60 hPa to 80 hPa by using a raw material gas composition of $AlCl_3$: 0.5 mol % to 4.5 mol %, $CO_2$: 2.5 mol % to 4.0 mol %, HCl: 2.0 mol % to 3.0 mol %, $H_2S$: 0.15 mol % to 0.25 mol %, and $H_2$: balance (roughness control step). It is preferable that the ratio of $AlCl_3$ in the roughness control step be relatively lower than the ratio of $AlCl_3$ in the film formation step.

In order to adjust the RSA to a specific value or more, the oxidation treatment time in the oxidation step may be controlled, the ratio of CO in the gas composition in the oxidation step and/or the nucleation step may be controlled, or the film formation temperature in the film formation step may be controlled. More specifically, the RSA can be increased by increasing the oxidation treatment time in the oxidation step, increasing the ratio of CO in the gas composition in the oxidation step and/or the nucleation step, or raising the film formation temperature in the film formation step above the nucleation temperature in the nucleation step.

In order to set the kurtosis roughness ($S_{ku}$) and the skewness roughness ($S_{sk}$) within the predetermined ranges, the ratio of $AlCl_3$ in the roughness control step may be made lower than the ratio of $AlCl_3$ in the film formation step. Where the difference in the ratio of $AlC_3$ between the roughness control step and the film formation step is increased, the kurtosis roughness ($S_{ku}$) tends to increase, and the skewness roughness ($S_{sk}$) tends to decrease.

Next, an upper layer including a TiCN layer is formed on the surface of the intermediate layer. The upper layer is formed by chemical vapor deposition at a temperature of 950° C. to 1000° C. and a pressure of 60 hPa to 80 hPa by using a raw material composition of $TiC_4$: 4.0 mol % to 8.0 mol %, $CH_3CN$: 0.5 mol % to 2.0 mol %, $N_2$: 0.0 mol % to 15.0 mol %, and $H_2$: balance (upper layer formation step).

In order to adjust the RSB to a specific value or more, the temperature may be controlled or the ratio of $CH_3CN$ in the raw material composition may be controlled in the upper layer formation step. More specifically, RSB (area %) can be increased by increasing the temperature in the upper layer formation step or increasing the ratio of $CH_3CN$ in the raw material composition.

The thickness of each layer in the coating layer of the coated cutting tool of the present embodiment can be measured by observing a cross-sectional structure of the coated cutting tool, using an optical microscope, a scanning electron microscope (SEM), a FE-SEM, or the like. It should be noted that, as to the average thickness of each layer in the coated cutting tool of the present embodiment, such average thickness can be obtained by: measuring the thickness of each layer at three or more locations near the position 50 μm from the edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS), or the like.

EXAMPLES

Hereinafter, the present invention will be described in greater detail with reference to examples, but the present invention is not limited to these examples.

Substrate

The following substrate was subjected to round honing on the edge line of the cutting edge with an SiC brush, and then the surface of the substrate was washed.

Substrate 1
Shape: CNMG120412
Material: cemented carbide (88.9WC-7.9Co-1.5TiN-1.4NbC-0.3$Cr_3C_2$ (the above numbers are mass %))

Substrate 2
Shape: CNMG120412
Material: Cemented carbide (89.7WC-7.1Co-1.5TiN-1.5NbC-0.2$Cr_3C_2$ (the above numbers are mass %))

Method for Measuring RSA and RSB

Regarding RSA and RSB, the following cross sections were observed under the following conditions with a field emission scanning electron microscope (hereinafter, also referred to as "FE-SEM"), and the sum total ($RSA_{total}$ or $RSB_{total}$) of the areas of grains cross sections in the cross section having the orientation difference within the range of 0 degrees or more and 45 degrees or less was measured by the below-described "Method for Measuring Grain Cross-section Having Specific Orientation Difference" by using an electron backscattering analysis imaging device (hereinafter, referred to as "EBSD") attached to the FE-SEM.

The cross-sectional area of the grains having the orientation difference in the range of 0 degrees or more and 45 degrees or less was divided into divisions at every 5-degree pitch, and the area of the grain cross-section for each division was determined. Next, the sum total of areas of grain cross-sections in each division of the division having the orientation difference of 0 degrees or more and less than 10 degrees, the division having the orientation difference of 10 degrees or more and less than 20 degrees, the division having the orientation difference of 20 degrees or more and less than 30 degrees, and the division having the orientation difference of 30 degrees or more and 45 degrees or less was determined. The sum total of the areas of grain cross-sections having the orientation difference of 0 degrees or more and 45 degrees or less is taken as 100 area %.

The ratio of the cross-sectional area of the grains having the orientation difference in the range of 0 degrees or more and less than 10 degrees with respect to the sum total of the areas of grain cross-sections in the cross section having the orientation difference within the range of 0 degrees or more and 45 degrees or less is taken as RSA, RSB. The results of the above measurements are shown in Table 7 below.

Conditions

RSA

Measurement plane: first plane (a plane located 0.5 μm from the interface of the intermediate layer on the upper layer side toward the substrate side and parallel to the interface between the substrate and the lower layer).

Method for shaving the measurement surface: polishing was performed with a diamond paste until the measurement plane was exposed to obtain a mirror-polished surface.

Orientation difference: orientation difference A (the angle (unit: degree) between the normal to the first cross section and the normal to the (001) orientation of a grain of α-$Al_2O_3$).

RSB

Measurement plane: second plane (a plane located 0.5 μm from the interface of the upper layer on the intermediate layer side toward the interface on the opposite side and parallel to the interface between the substrate and the lower layer).

Method for shaving the measurement surface: polishing was performed with a diamond paste until the measurement plane was exposed to obtain a mirror-polished surface.

Orientation difference: orientation difference B (the angle (unit: degree) between the normal to the second cross section and the normal to the (111) orientation of a grain of TiCN in the second cross section).

Method for Measuring Grain Cross-section Having Specific Orientation Difference

The sample was set on the FE-SEM. The sample was irradiated with an electron beam at an incident angle of 70 degrees, an acceleration voltage of 15 kV and an irradiation current of 1.0 nA. The orientation difference and cross-sectional area of each grain were measured in a measurement range of 30 μm×50 μm with an EBSD setting of a step size of 0.1 μm. The area of the grain cross-section in the intermediate layer within the measurement range was the sum of pixels corresponding to the area. That is, the sum of the areas of the grain cross-sections in each division at each pitch of 10 degrees or 15 degrees based on the orientation difference A of the grains of each layer was determined by summing up the pixels occupied by the grain cross-section corresponding to each division and converting to the area.

Kurtosis Roughness ($S_{ku}$) and Skewness Roughness ($S_{sk}$)

After forming the coating layer, the coated cutting tool was immersed in a mixed solution of hydrofluoric acid and nitric acid for about 5 min to 30 min to remove the upper layer. Where the upper layer was removed, the surface structure of the intermediate layer was exposed. Therefore, using a laser roughness measuring device "VK-X100" (product name, manufactured by Keyence Corporation), the range of 144 μm×108 μm was conformed to ISO 25178, and the kurtosis roughness ($S_{ku}$) and the skewness roughness ($S_{sk}$) of the surface of the intermediate layer were calculated. The kurtosis roughness ($S_{ku}$) and the skewness roughness ($S_{sk}$) of the surface of the intermediate layer were each calculated at three locations, and the average values thereof were defined as kurtosis roughness ($S_{ku}$) and skewness roughness ($S_{sk}$).

Method for Measuring Layer Thickness

Using the FE-SEM, the thickness at three locations in a cross section near the position of 50 μm from the edge line of the cutting edge of the coated cutting tool toward the center of the flank surface was measured, and the arithmetic mean value was calculated as the average thickness. The composition of each layer of the obtained sample was measured using EDS in a cross section near a position of 50 μm from the edge line of the cutting edge of the coated cutting tool toward the center of the flank surface.

Invention Samples 1 to 17 and Comparative Samples 1 to 8

After washing the surface of the substrate, a coating layer was formed by a chemical vapor deposition method. First, the substrate was loaded into a chemical vapor deposition apparatus of an external heating system, and the first layer having the composition shown in Table 7 was formed on the surface of the substrate under the conditions of the raw material composition, temperature, and pressure shown in Table 1 to obtain the average thickness shown in Table 7. Next, a second layer having the composition shown in Table 7 was formed on the surface of the first layer under the conditions of the raw material composition, temperature, and pressure shown in Table 1 to obtain the average thickness shown in Table 7. Next, a third layer having the composition shown in Table 7 was formed on the surface of the second layer under the conditions of the raw material composition, temperature, and pressure shown in Table 1 to obtain the average thickness shown in Table 7. Thus, a lower layer consisting of three layers was formed. Thereafter, the surface of the third layer was oxidized for the time shown in Table 2 under the conditions of the composition, temperature, and pressure shown in Table 2. Then, nuclei of α-aluminum oxide (α-$Al_2O_3$) were formed on the surface of the oxidized third layer under the conditions of the raw material composition, temperature and pressure shown in Table 3. Further, an intermediate layer having the composition shown in Table 7 was formed on the surface of the third layer and the nuclei of α-aluminum oxide (α-$Al_2O_3$) under the conditions of the raw material composition, temperature and pressure shown in Table 4 so as to have a thickness of 30% of the average thickness shown in Table 7, the conditions were changed to those shown in Table 5, and a roughness control step of the intermediate layer was performed to obtain the desired kurtosis roughness ($S_{ku}$) and skewness roughness ($S_{sk}$) and form an intermediate layer having an average thickness shown in Table 7. Finally, an upper layer having the composition shown in Table 7 was formed on the surface of the α-$Al_2O_3$ layer under the conditions of the raw material composition, temperature and pressure shown in Table 6 so as to have the average thickness shown in Table 7. Thus, coated cutting tools of the invention samples 1 to 17 and the comparative samples 1 to 8 were obtained.

The thickness of each layer of the sample was determined as follows. That is, by using the FE-SEM, the thickness at three locations in a cross section near a position of 50 μm from the edge line of the cutting edge of the coated cutting tool toward the center of the rake surface was measured, and the arithmetic mean value was taken as the average thickness. The composition of each layer of the obtained sample was measured by using EDS in a cross section near a position at up to 50 μm from the edge line of the cutting edge of the coated cutting tool to the center of the rake surface.

TABLE 1

| Composition of each layer | Temperature (° C.) | Pressure (hPa) | Composition of raw materials (mol %) |
|---|---|---|---|
| TiN (lower layer, first layer) | 900 | 350 | $TiCl_4$: 7.5%, $N_2$: 40.0%, $H_2$: 52.5% |
| TiC (lower layer, first layer) | 1000 | 75 | $TiCl_4$: 2.4%, $CH_4$: 4.6%, $H_2$: 93.0% |
| TiCN (lower layer, second layer) | 850 | 70 | $TiCl_4$: 6.0%, $CH_3CN$: 1.0%, $H_2$: 93.0% |
| TiCNO (lower layer, third layer) | 1000 | 100 | $TiCl_4$: 3.5%, CO: 0.7%, $N_2$: 35.5%, $H_2$: 60.3% |
| TiCO (lower layer, third layer) | 1000 | 80 | $TiCl_4$: 1.5%, CO: 2.5%, $H_2$: 96.0% |
| TiN (upper layer: comparativesample) | 1000 | 350 | $TiCl_4$: 7.5%, $N_2$: 40.0%, $H_2$: 52.5% |

TABLE 2

| | Oxidation treatment | | | | | |
|---|---|---|---|---|---|---|
| | Temperature (° C.) | Pressure (hPa) | Composition of raw materials (mol %) | | | Time (min) |
| | | | CO | $CO_2$ | $H_2$ | |
| Invention sample 1 | 1000 | 55 | 0.3 | 0.5 | 99.2 | 2 |
| Invention sample 2 | 1000 | 55 | 0.3 | 0.5 | 99.2 | 2 |
| Invention sample 3 | 1000 | 55 | 0.3 | 0.5 | 99.2 | 2 |
| Invention sample 4 | 1000 | 55 | 0.1 | 0.5 | 99.4 | 2 |
| Invention sample 5 | 1000 | 55 | 0.3 | 0.5 | 99.2 | 3 |
| Invention sample 6 | 1000 | 55 | 0.3 | 0.5 | 99.2 | 2 |
| Invention sample 7 | 1000 | 55 | 0.3 | 0.5 | 99.2 | 2 |
| Invention sample 8 | 1000 | 55 | 0.3 | 0.5 | 99.2 | 2 |
| Invention sample 9 | 1000 | 55 | 0.3 | 0.5 | 99.2 | 2 |
| Invention sample 10 | 1000 | 55 | 0.3 | 0.5 | 99.2 | 2 |
| Invention sample 11 | 1000 | 55 | 0.3 | 0.5 | 99.2 | 2 |
| Invention sample 12 | 1000 | 55 | 0.3 | 0.5 | 99.2 | 2 |

TABLE 2-continued

| | Oxidation treatment | | | | | |
|---|---|---|---|---|---|---|
| | Temperature | Pressure | Composition of raw materials (mol %) | | | Time |
| | (° C.) | (hPa) | CO | CO$_2$ | H$_2$ | (min) |
| Invention sample 13 | 1000 | 55 | 0.3 | 0.5 | 99.2 | 2 |
| Invention sample 14 | 1000 | 55 | 0.3 | 0.5 | 99.2 | 2 |
| Invention sample 15 | 1000 | 55 | 0.3 | 0.5 | 99.2 | 2 |
| Invention sample 16 | 1000 | 55 | 0.3 | 0.5 | 99.2 | 2 |
| Invention sample 17 | 1000 | 55 | 0.3 | 0.5 | 99.2 | 2 |
| Comparative sample 1 | 1000 | 55 | 0 | 0.5 | 99.5 | 1 |
| Comparative sample 2 | 1000 | 55 | 0.3 | 0.5 | 99.2 | 2 |
| Comparative sample 3 | 1000 | 55 | 0.3 | 0.5 | 99.2 | 2 |
| Comparative sample 4 | 1000 | 55 | 0.3 | 0.5 | 99.2 | 2 |
| Comparative sample 5 | 1000 | 55 | 0.3 | 0.5 | 99.2 | 2 |
| Comparative sample 6 | 1000 | 55 | 0.3 | 0.5 | 99.2 | 2 |
| Comparative sample 7 | 1000 | 55 | 0 | 0.5 | 99.5 | 1 |
| Comparative sample 8 | 1000 | 55 | 0 | 0.5 | 99.5 | 1 |

TABLE 3

| | Intermediate layer (nucleation step) | | | | | | |
|---|---|---|---|---|---|---|---|
| | Temperature | Pressure | Composition of raw materials (mol %) | | | | |
| | (° C.) | (hPa) | AlCl$_3$ | CO | CO$_2$ | HCl | H$_2$ |
| Invention sample 1 | 900 | 70 | 2.0 | 1.0 | 1.5 | 2.5 | 93.0 |
| Invention sample 2 | 900 | 70 | 2.0 | 1.0 | 1.5 | 2.5 | 93.0 |
| Invention sample 3 | 900 | 70 | 2.0 | 1.0 | 1.5 | 2.5 | 93.0 |
| Invention sample 4 | 920 | 70 | 2.5 | 0.5 | 2.0 | 2.5 | 92.5 |
| Invention sample 5 | 920 | 70 | 2.5 | 1.5 | 2.0 | 2.5 | 91.5 |
| Invention sample 6 | 900 | 70 | 2.0 | 1.0 | 1.5 | 2.5 | 93.0 |
| Invention sample 7 | 900 | 70 | 2.0 | 1.0 | 1.5 | 2.5 | 93.0 |
| Invention sample 8 | 900 | 70 | 2.0 | 1.0 | 1.5 | 2.5 | 93.0 |
| Invention sample 9 | 900 | 70 | 2.0 | 1.0 | 1.5 | 2.5 | 93.0 |
| Invention sample 10 | 900 | 70 | 2.0 | 1.0 | 1.5 | 2.5 | 93.0 |
| Invention sample 11 | 900 | 70 | 2.0 | 1.0 | 1.5 | 2.5 | 93.0 |
| Invention sample 12 | 900 | 70 | 2.0 | 1.0 | 1.5 | 2.5 | 93.0 |
| Invention sample 13 | 900 | 70 | 2.0 | 1.0 | 1.5 | 2.5 | 93.0 |
| Invention sample 14 | 900 | 70 | 2.0 | 1.0 | 1.5 | 2.5 | 93.0 |
| Invention sample 15 | 900 | 70 | 2.0 | 1.0 | 1.5 | 2.5 | 93.0 |
| Invention sample 16 | 900 | 70 | 2.0 | 1.0 | 1.5 | 2.5 | 93.0 |
| Invention sample 17 | 900 | 70 | 2.0 | 1.0 | 1.5 | 2.5 | 93.0 |
| Comparative sample 1 | 1000 | 70 | 2.5 | 0.0 | 1.0 | 2.5 | 94.0 |
| Comparative sample 2 | 900 | 70 | 2.0 | 1.0 | 1.5 | 2.5 | 93.0 |
| Comparative sample 3 | 900 | 70 | 2.0 | 1.0 | 1.5 | 2.5 | 93.0 |
| Comparative sample 4 | 900 | 70 | 2.0 | 1.0 | 1.5 | 2.5 | 93.0 |
| Comparative sample 5 | 900 | 70 | 2.0 | 1.0 | 1.5 | 2.5 | 93.0 |
| Comparative sample 6 | 900 | 70 | 2.0 | 1.0 | 1.5 | 2.5 | 93.0 |
| Comparative sample 7 | 1000 | 70 | 2.5 | 0.0 | 1.0 | 2.5 | 94.0 |
| Comparative sample 8 | 1000 | 70 | 2.5 | 0.0 | 1.0 | 2.5 | 94.0 |

TABLE 4

| | Intermediate layer (film formation step) | | | | | | |
|---|---|---|---|---|---|---|---|
| | Temperature | Pressure | Composition of raw materials (mol %) | | | | |
| | (° C.) | (hPa) | AlCl$_3$ | CO$_2$ | HCl | H$_2$S | H$_2$ |
| Invention sample 1 | 990 | 70 | 4.0 | 3.0 | 2.5 | 0.20 | 90.3 |
| Invention sample 2 | 990 | 70 | 4.0 | 3.0 | 2.5 | 0.20 | 90.3 |
| Invention sample 3 | 990 | 70 | 4.0 | 3.0 | 2.5 | 0.20 | 90.3 |
| Invention sample 4 | 990 | 70 | 4.0 | 3.0 | 2.5 | 0.20 | 90.3 |
| Invention sample 5 | 990 | 70 | 4.0 | 3.0 | 2.5 | 0.20 | 90.3 |
| Invention sample 6 | 990 | 70 | 4.0 | 3.0 | 2.5 | 0.20 | 90.3 |
| Invention sample 7 | 990 | 70 | 4.0 | 3.0 | 2.5 | 0.20 | 90.3 |

TABLE 4-continued

| | Intermediate layer (film formation step) | | | | | | |
|---|---|---|---|---|---|---|---|
| | Temperature | Pressure | Composition of raw materials (mol %) | | | | |
| | (° C.) | (hPa) | $AlCl_3$ | $CO_2$ | HCl | $H_2S$ | $H_2$ |
| Invention sample 8 | 990 | 70 | 4.0 | 3.0 | 2.5 | 0.20 | 90.3 |
| Invention sample 9 | 990 | 70 | 4.0 | 3.0 | 2.5 | 0.20 | 90.3 |
| Invention sample 10 | 990 | 70 | 4.0 | 3.0 | 2.5 | 0.20 | 90.3 |
| Invention sample 11 | 990 | 70 | 4.0 | 3.0 | 2.5 | 0.20 | 90.3 |
| Invention sample 12 | 990 | 70 | 4.0 | 3.0 | 2.5 | 0.20 | 90.3 |
| Invention sample 13 | 990 | 70 | 4.0 | 3.0 | 2.5 | 0.20 | 90.3 |
| Invention sample 14 | 990 | 70 | 4.0 | 3.0 | 2.5 | 0.20 | 90.3 |
| Invention sample 15 | 990 | 70 | 4.0 | 3.0 | 2.5 | 0.20 | 90.3 |
| Invention sample 16 | 990 | 70 | 4.0 | 3.0 | 2.5 | 0.20 | 90.3 |
| Invention sample 17 | 990 | 70 | 4.0 | 3.0 | 2.5 | 0.20 | 90.3 |
| Comparative sample 1 | 990 | 70 | 4.0 | 3.0 | 2.5 | 0.20 | 90.3 |
| Comparative sample 2 | 990 | 70 | 4.0 | 3.0 | 2.5 | 0.20 | 90.3 |
| Comparative sample 3 | 990 | 70 | 4.0 | 3.0 | 2.5 | 0.20 | 90.3 |
| Comparative sample 4 | 990 | 70 | 4.0 | 3.0 | 2.5 | 0.20 | 90.3 |
| Comparative sample 5 | 990 | 70 | 4.0 | 3.0 | 2.5 | 0.20 | 90.3 |
| Comparative sample 6 | 990 | 70 | 4.0 | 3.0 | 2.5 | 0.20 | 90.3 |
| Comparative sample 7 | 990 | 70 | 4.0 | 3.0 | 2.5 | 0.20 | 90.3 |
| Comparative sample 8 | 990 | 70 | 4.0 | 3.0 | 2.5 | 0.20 | 90.3 |

TABLE 5

| | Intermediate layer (roughness control step) | | | | | | |
|---|---|---|---|---|---|---|---|
| | Temperature | Pressure | Composition of raw materials (mol %) | | | | |
| | (° C.) | (hPa) | $AlCl_3$ | $CO_2$ | HCl | $H_2S$ | $H_2$ |
| Invention sample 1 | 990 | 70 | 2.5 | 3.0 | 2.5 | 0.20 | 91.8 |
| Invention sample 2 | 990 | 70 | 3.0 | 3.0 | 2.5 | 0.20 | 91.3 |
| Invention sample 3 | 990 | 70 | 2.0 | 3.0 | 2.5 | 0.20 | 92.3 |
| Invention sample 4 | 990 | 70 | 3.0 | 3.0 | 2.5 | 0.20 | 91.3 |
| Invention sample 5 | 990 | 70 | 2.5 | 3.0 | 2.5 | 0.20 | 91.8 |
| Invention sample 6 | 990 | 70 | 2.5 | 3.0 | 2.5 | 0.20 | 91.8 |
| Invention sample 7 | 990 | 70 | 2.5 | 3.0 | 2.5 | 0.20 | 91.8 |
| Invention sample 8 | 990 | 70 | 2.5 | 3.0 | 2.5 | 0.20 | 91.8 |
| Invention sample 9 | 990 | 70 | 3.0 | 3.0 | 2.5 | 0.20 | 91.3 |
| Invention sample 10 | 990 | 70 | 2.5 | 3.0 | 2.5 | 0.20 | 91.8 |
| Invention sample 11 | 990 | 70 | 2.5 | 3.0 | 2.5 | 0.20 | 91.8 |
| Invention sample 12 | 990 | 70 | 2.5 | 3.0 | 2.5 | 0.20 | 91.8 |
| Invention sample 13 | 990 | 70 | 1.5 | 3.0 | 2.5 | 0.20 | 92.8 |
| Invention sample 14 | 990 | 70 | 1.2 | 3.0 | 2.5 | 0.20 | 93.1 |
| Invention sample 15 | 990 | 70 | 2.5 | 3.0 | 2.5 | 0.20 | 91.8 |
| Invention sample 16 | 990 | 70 | 2.5 | 3.0 | 2.5 | 0.20 | 91.8 |
| Invention sample 17 | 990 | 70 | 1.0 | 3.0 | 2.5 | 0.20 | 93.3 |
| Comparative sample 1 | 990 | 70 | 2.5 | 3.0 | 2.5 | 0.20 | 91.8 |
| Comparative sample 2 | 990 | 70 | 2.5 | 3.0 | 2.5 | 0.20 | 91.8 |
| Comparative sample 3 | 990 | 70 | 2.5 | 3.0 | 2.5 | 0.20 | 91.8 |
| Comparative sample 4 | 990 | 70 | 2.5 | 3.0 | 2.5 | 0.20 | 91.8 |
| Comparative sample 5 | 990 | 70 | 4.0 | 3.0 | 2.5 | 0.20 | 90.3 |
| Comparative sample 6 | 990 | 70 | 4.0 | 3.0 | 2.5 | 0.20 | 90.3 |
| Comparative sample 7 | 990 | 70 | 3.0 | 3.0 | 2.5 | 0.20 | 91.3 |
| Comparative sample 8 | 990 | 70 | 2.5 | 3.0 | 2.5 | 0.20 | 91.8 |

TABLE 6

| | Upper layer | | | | | | |
|---|---|---|---|---|---|---|---|
| | Temperature | Pressure | Composition of raw materials (mol %) | | | | |
| | (° C.) | (hPa) | $TiCl_4$ | $CH_3CN$ | $CH_4$ | $N_2$ | $H_2$ |
| Invention sample 1 | 1000 | 70 | 6.0 | 1.0 | 0.0 | 5.0 | 88.0 |
| Invention sample 2 | 1000 | 70 | 6.0 | 1.0 | 0.0 | 5.0 | 88.0 |

TABLE 6-continued

| | Upper layer | | | | | | |
|---|---|---|---|---|---|---|---|
| | Temperature | Pressure | Composition of raw materials (mol %) | | | | |
| | (° C.) | (hPa) | TiCl$_4$ | CH$_3$CN | CH$_4$ | N$_2$ | H$_2$ |
| Invention sample 3 | 1000 | 70 | 6.0 | 1.0 | 0.0 | 5.0 | 88.0 |
| Invention sample 4 | 1000 | 70 | 6.0 | 0.7 | 0.0 | 5.0 | 88.3 |
| Invention sample 5 | 1000 | 70 | 6.0 | 1.0 | 0.0 | 5.0 | 88.0 |
| Invention sample 6 | 1050 | 70 | 6.0 | 2.0 | 0.0 | 5.0 | 87.0 |
| Invention sample 7 | 1000 | 70 | 6.0 | 1.0 | 0.0 | 5.0 | 88.0 |
| Invention sample 8 | 1000 | 70 | 6.0 | 0.7 | 0.0 | 5.0 | 88.3 |
| Invention sample 9 | 1000 | 70 | 6.0 | 1.0 | 0.0 | 5.0 | 88.0 |
| Invention sample 10 | 1000 | 70 | 6.0 | 0.7 | 0.0 | 5.0 | 88.3 |
| Invention sample 11 | 1000 | 70 | 6.0 | 1.0 | 0.0 | 5.0 | 88.0 |
| Invention sample 12 | 1000 | 70 | 6.0 | 1.0 | 0.0 | 5.0 | 88.0 |
| Invention sample 13 | 1000 | 70 | 6.0 | 1.0 | 0.0 | 5.0 | 88.0 |
| Invention sample 14 | 1000 | 70 | 6.0 | 1.0 | 0.0 | 5.0 | 88.0 |
| Invention sample 15 | 1000 | 70 | 6.0 | 1.0 | 0.0 | 5.0 | 88.0 |
| Invention sample 16 | 1000 | 70 | 6.0 | 1.0 | 0.0 | 5.0 | 88.0 |
| Invention sample 17 | 1000 | 70 | 6.0 | 1.0 | 0.0 | 5.0 | 88.0 |
| Comparative sample 1 | 1000 | 70 | 6.0 | 1.0 | 0.0 | 5.0 | 88.0 |
| Comparative sample 2 | 1000 | 70 | 6.0 | 0.0 | 1.5 | 15.0 | 77.5 |
| Comparative sample 3 | 1000 | 70 | 6.0 | 1.0 | 0.0 | 5.0 | 88.0 |
| Comparative sample 4 | 1000 | 350 | 7.5 | 0.0 | 0.0 | 40.0 | 52.5 |
| Comparative sample 5 | 1000 | 70 | 6.0 | 1.0 | 0.0 | 5.0 | 88.0 |
| Comparative sample 6 | 1000 | 70 | 6.0 | 1.0 | 0.0 | 5.0 | 88.0 |
| Comparative sample 7 | 1000 | 70 | 6.0 | 0.0 | 1.5 | 15.0 | 77.5 |
| Comparative sample 8 | 1000 | 70 | 6.0 | 1.0 | 0.0 | 5.0 | 88.0 |

TABLE 7

| | Coating layer | | | | | | | | | | | |
|---|---|---|---|---|---|---|---|---|---|---|---|---|
| | Lower layer | | | | | | | Intermediate layer | | | Upper layer | Thickness of entire coating layer (μm) |
| | First layer | | Second layer | | Third layer | | Average thickness of entire lower layer (μm) | | | | | |
| | Composition | Average thickness (μm) | Composition | Average thickness (μm) | Composition | Average thickness (μm) | | Composition | Crystal system | Average thickness (μm) | Composition | Average thickness (μm) | |
| Invention sample 1 | TiN | 0.2 | TiCN | 6.0 | TiCNO | 0.3 | 6.5 | Al$_2$O$_3$ | α | 6.0 | TiCN | 3.0 | 15.5 |
| Invention sample 2 | TiN | 0.2 | TiCN | 6.0 | TiCNO | 0.3 | 6.5 | Al$_2$O$_3$ | α | 6.0 | TiCN | 3.0 | 15.5 |
| Invention sample 3 | TiN | 0.2 | TiCN | 6.0 | TiCNO | 0.3 | 6.5 | Al$_2$O$_3$ | α | 6.0 | TiCN | 3.0 | 15.5 |
| Invention sample 4 | TiN | 0.2 | TiCN | 6.0 | TiCNO | 0.3 | 6.5 | Al$_2$O$_3$ | α | 6.0 | TiCN | 3.0 | 15.5 |
| Invention sample 5 | TiN | 0.2 | TiCN | 6.0 | TiCNO | 0.3 | 6.5 | Al$_2$O$_3$ | α | 6.0 | TiCN | 3.0 | 15.5 |
| Invention sample 6 | TiN | 0.2 | TiCN | 6.0 | TiCNO | 0.3 | 6.5 | Al$_2$O$_3$ | α | 6.0 | TiCN | 3.0 | 15.5 |
| Invention sample 7 | TiN | 0.2 | TiCN | 3.5 | TiCNO | 0.3 | 4.0 | Al$_2$O$_3$ | α | 6.0 | TiCN | 3.0 | 13.0 |
| Invention sample 8 | TiN | 0.2 | TiCN | 11.0 | TiCNO | 0.3 | 11.5 | Al$_2$O$_3$ | α | 6.0 | TiCN | 3.0 | 20.5 |
| Invention sample 9 | TiN | 0.2 | TiCN | 6.0 | TiCNO | 0.3 | 6.5 | Al$_2$O$_3$ | α | 3.2 | TiCN | 3.0 | 12.7 |
| Invention sample 10 | TiN | 0.2 | TiCN | 6.0 | TiCNO | 0.3 | 6.5 | Al$_2$O$_3$ | α | 9.7 | TiCN | 3.0 | 19.2 |
| Invention sample 11 | TiN | 0.2 | TiCN | 6.0 | TiCNO | 0.3 | 6.5 | Al$_2$O$_3$ | α | 6.0 | TiCN | 1.3 | 13.8 |
| Invention sample 12 | TiN | 0.2 | TiCN | 6.0 | TiCNO | 0.3 | 6.5 | Al$_2$O$_3$ | α | 6.0 | TiCN | 8.8 | 21.3 |
| Invention sample 13 | TiN | 0.2 | TiCN | 8.0 | TiCNO | 0.3 | 8.5 | Al$_2$O$_3$ | α | 8.0 | TiCN | 4.0 | 20.5 |
| Invention sample 14 | TiN | 0.2 | TiCN | 8.0 | TiCNO | 0.3 | 8.5 | Al$_2$O$_3$ | α | 8.0 | TiCN | 4.0 | 20.5 |
| Invention sample 15 | TiC | 0.2 | TiCN | 6.0 | TiCNO | 0.3 | 6.5 | Al$_2$O$_3$ | α | 6.0 | TiCN | 3.0 | 15.5 |
| Invention sample 16 | TiN | 0.2 | TiCN | 6.0 | TiCO | 0.3 | 6.5 | Al$_2$O$_3$ | α | 6.0 | TiCN | 3.0 | 15.5 |

TABLE 7-continued

| | Coating layer | | | | | | | | | | | |
|---|---|---|---|---|---|---|---|---|---|---|---|---|
| | Lower layer | | | | | | | | | Upper layer | | Thickness of entire coating layer (μm) |
| | First layer | | Second layer | | Third layer | | Average thickness of entire lower layer (μm) | Intermediate layer | | | | |
| | Composition | Average thickness (μm) | Composition | Average thickness (μm) | Composition | Average thickness (μm) | | Composition | Crystal system | Average thickness (μm) | Composition | Average thickness (μm) | |
| Invention sample 17 | TiN | 0.2 | TiCN | 10.0 | TiCNO | 0.3 | 10.5 | $Al_2O_3$ | α | 8.0 | TiCN | 6.0 | 24.5 |
| Comparative sample 1 | TiN | 0.2 | TiCN | 6.0 | TiCNO | 0.3 | 6.5 | $Al_2O_3$ | α | 6.0 | TiCN | 3.0 | 15.5 |
| Comparative sample 2 | TiN | 0.2 | TiCN | 6.0 | TiCNO | 0.3 | 6.5 | $Al_2O_3$ | α | 6.0 | TiCN | 3.0 | 15.5 |
| Comparative sample 3 | TiN | 0.2 | TiCN | 12.0 | TiCNO | 0.3 | 12.5 | $Al_2O_3$ | α | 12.0 | TiCN | 2.0 | 26.5 |
| Comparative sample 4 | TiN | 0.2 | TiCN | 6.0 | TiCNO | 0.3 | 6.5 | $Al_2O_3$ | α | 9.0 | TiN | 2.0 | 17.5 |
| Comparative sample 5 | TiN | 0.2 | TiCN | 6.0 | TiCNO | 0.3 | 6.5 | $Al_2O_3$ | α | 9.0 | TiCN | 2.0 | 17.5 |
| Comparative sample 6 | TiN | 0.2 | TiCN | 6.0 | TiCNO | 0.3 | 6.5 | $Al_2O_3$ | α | 6.0 | TiCN | 8.8 | 21.3 |
| Comparative sample 7 | TiN | 0.2 | TiCN | 10.0 | TiCNO | 0.3 | 10.5 | $Al_2O_3$ | α | 8.0 | TiCN | 6.0 | 24.5 |
| Comparative sample 8 | TiN | 0.2 | TiCN | 6.0 | TiCNO | 0.3 | 6.5 | $Al_2O_3$ | α | 8.0 | TiCN | 0.5 | 15.0 |

The RSA was measured by the above-described method on across section at 0.5 μm from the surface of the intermediate layer toward the substrate side and parallel to the surface of the substrate in the intermediate layer of the obtained sample. The results are shown in Table 8 below.

The RSB was measured by the above-described method on a cross section at 0.5 μm from the surface of the upper layer toward the substrate side and parallel to the surface of the substrate in the upper layer of the obtained sample. The results are shown in Table 8 below.

TABLE 8

| | Intermediate layer RSA (area %) | | | | Upper layer RSB (area %) | | | |
|---|---|---|---|---|---|---|---|---|
| | 0° ≤ A < 10° | 10° ≤ A < 20° | 20° ≤ A < 30° | 30° ≤ A ≤ 45° | 0° ≤ B < 10° | 10° ≤ B < 20° | 20° ≤ B < 30° | 30° ≤ B ≤ 45° |
| Invention sample 1 | 61 | 10 | 19 | 10 | 52 | 15 | 14 | 19 |
| Invention sample 2 | 64 | 9 | 14 | 13 | 53 | 17 | 16 | 14 |
| Invention sample 3 | 59 | 10 | 19 | 12 | 54 | 14 | 15 | 17 |
| Invention sample 4 | 44 | 16 | 22 | 18 | 46 | 19 | 15 | 20 |
| Invention sample 5 | 71 | 9 | 10 | 10 | 56 | 13 | 12 | 19 |
| Invention sample 6 | 60 | 12 | 16 | 12 | 68 | 11 | 9 | 12 |
| Invention sample 7 | 59 | 12 | 20 | 9 | 49 | 14 | 18 | 19 |
| Invention sample 8 | 56 | 11 | 16 | 17 | 47 | 16 | 15 | 22 |
| Invention sample 9 | 59 | 12 | 20 | 9 | 49 | 14 | 18 | 19 |
| Invention sample 10 | 56 | 11 | 16 | 17 | 47 | 16 | 15 | 22 |
| Invention sample 11 | 59 | 13 | 18 | 10 | 52 | 14 | 12 | 22 |
| Invention sample 12 | 61 | 10 | 18 | 11 | 52 | 14 | 16 | 18 |
| Invention sample 13 | 63 | 9 | 12 | 16 | 55 | 16 | 14 | 15 |
| Invention sample 14 | 63 | 9 | 12 | 16 | 55 | 16 | 14 | 15 |
| Invention sample 15 | 62 | 10 | 18 | 10 | 52 | 16 | 15 | 17 |
| Invention sample 16 | 59 | 11 | 18 | 12 | 50 | 14 | 18 | 18 |
| Invention sample 17 | 61 | 12 | 14 | 13 | 60 | 13 | 12 | 15 |
| Comparative sample 1 | 18 | 20 | 38 | 24 | 46 | 20 | 14 | 20 |
| Comparative sample 2 | 58 | 14 | 16 | 12 | 20 | 24 | 12 | 44 |
| Comparative sample 3 | 59 | 11 | 19 | 11 | 50 | 15 | 17 | 18 |
| Comparative sample 4 | 60 | 10 | 17 | 13 | 50 | 16 | 14 | 20 |
| Comparative sample 5 | 61 | 12 | 14 | 13 | 52 | 18 | 15 | 15 |
| Comparative sample 6 | 58 | 16 | 12 | 14 | 50 | 13 | 17 | 20 |

TABLE 8-continued

| | Intermediate layer RSA (area %) | | | | Upper layer RSB (area %) | | | |
|---|---|---|---|---|---|---|---|---|
| | 0° ≤ A < 10° | 10° ≤ A < 20° | 20° ≤ A < 30° | 30° ≤ A ≤ 45° | 0° ≤ B < 10° | 10° ≤ B < 20° | 20° ≤ B < 30° | 30° ≤ B ≤ 45° |
| Comparative sample 7 | 20 | 16 | 40 | 24 | 22 | 26 | 14 | 38 |
| Comparative sample 8 | 61 | 10 | 15 | 14 | 26 | 24 | 20 | 30 |

The kurtosis roughness ($S_{ku}$) and the skewness roughness ($S_{sk}$) of the interface on the upper layer side were measured by the above-described method. The results are shown in Table 9 below.

TABLE 9

| | Intermediate layer Interface on upper layer side | |
|---|---|---|
| | $S_{ku}$ | $S_{sk}$ |
| Invention sample 1 | 4.9 | −0.5 |
| Invention sample 2 | 3.2 | −0.2 |
| Invention sample 3 | 6.2 | −0.4 |
| Invention sample 4 | 3.5 | −0.3 |
| Invention sample 5 | 5.2 | −0.6 |
| Invention sample 6 | 4.8 | −0.5 |
| Invention sample 7 | 5.0 | −0.6 |
| Invention sample 8 | 4.8 | −0.6 |
| Invention sample 9 | 3.4 | −0.2 |
| Invention sample 10 | 4.5 | −0.4 |
| Invention sample 11 | 5.0 | −0.6 |
| Invention sample 12 | 5.4 | −0.5 |
| Invention sample 13 | 7.2 | −1.1 |
| Invention sample 14 | 9.5 | −2.3 |
| Invention sample 15 | 5.0 | −0.5 |
| Invention sample 16 | 4.8 | −0.5 |
| Invention sample 17 | 11.6 | −2.6 |
| Comparative sample 1 | 4.6 | −0.5 |
| Comparative sample 2 | 4.5 | −0.4 |
| Comparative sample 3 | 5.0 | −0.6 |
| Comparative sample 4 | 4.8 | −0.5 |
| Comparative sample 5 | 2.4 | 0.1 |
| Comparative sample 6 | 2.3 | −0.1 |
| Comparative sample 7 | 3.7 | −0.2 |
| Comparative sample 8 | 4.7 | −0.5 |

Cutting Test

Using the obtained invention samples 1 to 17 and comparative samples 1 to 8, cutting test 1 and cutting test 2 were performed under the following conditions. The cutting test 1 is a wear test for evaluating wear resistance, and the cutting test 2 is a fracture test for evaluating fracture resistance. Table 10 shows the results of each cutting test.

Cutting Test 1: Wear Resistance Test
Workpiece material: round bar of S45C (hardness: 150 HB)
Cutting speed: 230 m/min
Feed: 0.25 mm/rev
Depth of cut: 1.8 mm
Coolant: used
Evaluation items: a time when the sample was fractured or had a maximum flank wear width of 0.3 mm was defined as the end of the tool life, and the machining time to reach the end of the tool life was measured. Moreover, the damage state at a processing time of 20 min was confirmed by SEM. The results are shown in Table 10. In the table, "Normal wear" means that there is wear without fractures or falling, "Fracture" means that a part of the coating layer is missing, "Grain falling" means that the falling of a grain of $Al_2O_3$ contained in the intermediate layer has been observed, "Upper layer peeling" means that peeling has occurred at the interface between the intermediate layer and the upper layer. In Comparative sample 3, a fracture occurred before 20 min.

Cutting Test 2: Fracture Resistance Test
Workpiece material: two grooved round bars of S45C (hardness: 200 HB)
Cutting speed: 200 m/min
Feed: 0.20 mm/rev
Depth of cut: 1.5 mm
Coolant: used
Evaluation items: a time when the sample was fractured or had a maximum flank wear width of 0.3 mm was defined as the end of the tool life, and the machining time to reach the end of the tool life was measured, and the number of shocks until the end of the tool life was measured. Further, the damage state when the number of shocks reached 5000 shocks was checked with an SEM. The number of shocks was setup to 15,000. The results are shown in Table 10. In the table, "Normal wear" means that there is wear without fractures or falling, and "Chipping" means that chipping is observed in a part of the coating layer.

TABLE 10

| | Coating layers | | | | | | | | Cutting test | | | |
|---|---|---|---|---|---|---|---|---|---|---|---|---|
| | Lower layer | Intermediate layer | | | | Upper layer | | | Cutting test 1 Wear resistance test | | Cutting test 2 Fracture resistance test | |
| | Average thickness of entire layer (µm) | Average thickness (µm) | RSA (area %) | $S_{ku}$ | $S_{sk}$ | Average thickness (µm) | Composition | RSB (area %) | Damage state at machining time of 20 min | Machining time (min) | Damage state at 5000 shocks | Number of shocks (shocks) |
| Invention sample 1 | 6.5 | 6.0 | 61 | 4.9 | −0.5 | 3.0 | TiCN | 52 | Normal wear | 64 | Normal wear | 14700 |
| Invention sample 2 | 6.5 | 6.0 | 64 | 3.2 | −0.2 | 3.0 | TiCN | 53 | Normal wear | 61 | Normal wear | 14300 |
| Invention sample 3 | 6.5 | 6.0 | 59 | 6.2 | −0.4 | 3.0 | TiCN | 54 | Normal wear | 68 | Normal wear | 15000 |

TABLE 10-continued

| | Coating layers | | | | | | | Cutting test | | | |
| --- | --- | --- | --- | --- | --- | --- | --- | --- | --- | --- | --- |
| | Lower layer | | | | | | | | Cutting test 1 Wear resistance test | | Cutting test 2 Fracture resistance test |
| | Average thickness | Intermediate layer | | | | Upper layer | | Damage | | | |
| | of entire layer (μm) | Average thickness (μm) | RSA (area %) | $S_{ku}$ | $S_{sk}$ | Average thickness (μm) | Composition | RSB (area %) | state at machining time of 20 min | Machining time (min) | Damage state at 5000 shocks | Number of shocks (shocks) |
| Invention sample 4 | 6.5 | 6.0 | 44 | 3.5 | −0.3 | 3.0 | TiCN | 46 | Normal wear | 59 | Normal wear | 15000 |
| Invention sample 5 | 6.5 | 6.0 | 71 | 5.2 | −0.6 | 3.0 | TiCN | 56 | Normal wear | 63 | Normal wear | 14300 |
| Invention sample 6 | 6.5 | 6.0 | 60 | 4.8 | −0.5 | 3.0 | TiCN | 68 | Normal wear | 69 | Normal wear | 15000 |
| Invention sample 7 | 4.0 | 6.0 | 59 | 5.0 | −0.6 | 3.0 | TiCN | 49 | Normal wear | 58 | Normal wear | 13800 |
| Invention sample 8 | 11.5 | 6.0 | 56 | 4.8 | −0.6 | 3.0 | TiCN | 47 | Normal wear | 69 | Normal wear | 13900 |
| Invention sample 9 | 6.5 | 3.2 | 59 | 3.4 | −0.2 | 3.0 | TiCN | 49 | Normal wear | 57 | Normal wear | 14000 |
| Invention sample 10 | 6.5 | 9.7 | 56 | 4.5 | −0.4 | 3.0 | TiCN | 47 | Normal wear | 65 | Normal wear | 13800 |
| Invention sample 11 | 6.5 | 6.0 | 59 | 5.0 | −0.6 | 1.3 | TiCN | 52 | Normal wear | 55 | Normal wear | 13400 |
| Invention sample 12 | 6.5 | 6.0 | 61 | 5.4 | −0.5 | 8.8 | TiCN | 52 | Normal wear | 77 | Normal wear | 13800 |
| Invention sample 13 | 8.5 | 8.0 | 63 | 7.2 | −1.1 | 4.0 | TiCN | 55 | Normal wear | 73 | Normal wear | 14400 |
| Invention sample 14 | 8.5 | 8.0 | 63 | 9.5 | −2.3 | 4.0 | TiCN | 55 | Normal wear | 75 | Normal wear | 14700 |
| Invention sample 15 | 6.5 | 6.0 | 62 | 5.0 | −0.5 | 3.0 | TiCN | 52 | Normal wear | 63 | Normal wear | 14300 |
| Invention sample 16 | 6.5 | 6.0 | 59 | 4.8 | −0.5 | 3.0 | TiCN | 50 | Normal wear | 61 | Normal wear | 14400 |
| Invention sample 17 | 10.5 | 8.0 | 61 | 11.6 | −2.6 | 6.0 | TiCN | 60 | Normal wear | 78 | Normal wear | 13300 |
| Comparative sample 1 | 6.5 | 6.0 | 18 | 4.6 | −0.5 | 3.0 | TiCN | 46 | Normal wear | 44 | Normal wear | 14600 |
| Comparative sample 2 | 6.5 | 6.0 | 58 | 4.5 | −0.4 | 3.0 | TiCN | 20 | Grain falling | 41 | Chipping | 12600 |
| Comparative sample 3 | 12.5 | 12.0 | 59 | 5.0 | −0.6 | 2.0 | TiCN | 50 | Fracture | 16 | Chipping | 13000 |
| Comparative sample 4 | 6.5 | 9.0 | 60 | 4.8 | −0.5 | 2.0 | TiN | 50 | Grain falling | 30 | Chipping | 10100 |
| Comparative sample 5 | 6.5 | 9.0 | 61 | 2.4 | 0.1 | 2.0 | TiCN | 52 | Upper layer peeling | 46 | Normal wear | 14400 |
| Comparative sample 6 | 6.5 | 6.0 | 58 | 2.3 | −0.1 | 8.8 | TiCN | 50 | Upper layer peeling | 50 | Normal wear | 14200 |
| Comparative sample 7 | 10.5 | 8.0 | 20 | 3.7 | −0.2 | 6.0 | TiCN | 22 | Grain falling | 43 | Chipping | 12400 |
| Comparative sample 8 | 6.5 | 8.0 | 61 | 4.7 | −0.5 | 0.5 | TiCN | 26 | Normal wear | 50 | Normal wear | 12500 |

From the above results, it was found that the invention samples had a long tool life as a result of excellent wear resistance and fracture resistance.

INDUSTRIAL APPLICABILITY

The tool life of the coated cutting tool of the present invention can be extended with respect to that of the conventional tools because excellent wear resistance is obtained without degrading the fracture resistance. From this viewpoint, the coated cutting tool of the present invention has industrial applicability.

REFERENCE SIGNS LIST

1: Substrate, 2: Lower layer, 3: Intermediate layer, 4: Upper layer, 5: Coating layer, 6: Coated cutting tool.

What is claimed is:
1. A coated cutting tool comprising a substrate and a coating layer formed on a surface of the substrate, wherein
the coating layer comprises a lower layer comprising one or more Ti compound layers containing a Ti compound of Ti and an element of at least one kind selected from the group consisting of C, N, O, and B; an intermediate layer comprising α-Al$_2$O$_3$; and an upper layer comprising TiCN;
the layers are laminated in this order from the substrate side toward a surface side of the coating layer;
the lower layer has an average thickness of 2.0 μm or more and 12.0 μm or less;
the intermediate layer has an average thickness of 3.0 μm or more and 10.0 μm or less;
a first cross section located up to 1 μm from an interface of the intermediate layer on the upper layer side toward the substrate side and parallel to an interface between the substrate and the lower layer satisfies a condition represented by following formula (1), $$RSA \geq 40 \quad (1)$$

in the formula, RSA is a ratio, in terms of area %, of a cross-sectional area of a grains having an orientation difference A of 0 degrees or more and less than 10 degrees to a cross-sectional area of grains having an orientation difference A of 0 degrees or more and 45 degrees or less in the first cross section, and the orientation difference A is an angle, in terms of degrees, between a normal to the first cross section and a normal to a (001) orientation of a grain of the α-Al$_2$O$_3$ in the intermediate layer;

the interface of the intermediate layer on the upper layer side has a kurtosis roughness ($S_{ku}$) of more than 3.0;

the interface of the intermediate layer on the upper layer side has a skewness roughness ($S_{sk}$) of less than 0;

the upper layer has an average thickness of 1.0 μm or more and 9.0 μm or less; and a second cross section located up to 1 μm from the interface of the upper layer on the intermediate layer side toward the interface on the opposite side and parallel to the interface between the substrate and the lower layer satisfies a condition represented by following formula (2), $$RSB \geq 40 \quad (2)$$

in the formula, RSB is a ratio, in terms of area %, of a cross-sectional area of grains having an orientation difference B of 0 degrees or more and less than 10 degrees to a cross-sectional area of grains having an orientation difference B of 0 degrees or more and 45 degrees or less in the second cross section, the orientation difference B is an angle, in terms of degrees, between a normal to the second cross section and a normal to a (111) orientation of a grain of the TiCN in the upper layer.

2. The coated cutting tool according to claim 1, wherein the kurtosis roughness ($S_{ku}$) is more than 3.0 and 10.0 or less.

3. The coated cutting tool according to claim 1, wherein the skewness roughness ($S_{sk}$) is −3.0 or more and less than 0.

4. The coated cutting tool according to claim 1, wherein the first cross section satisfies a condition represented by following formula (1-1), $$RSA \geq 50 \quad (1-1)$$

in the formula, RSA is as defined in the formula (1).

5. The coated cutting tool according to claim 1, wherein the second cross section satisfies a condition represented by following formula (2-1), $$RSB \geq 50 \quad (2-1)$$

in the formula, RSB is as defined in the formula (2).

6. The coated cutting tool according to claim 1, wherein the average thickness of the entire coating layer is 8.0 μm or more and 30.0 μm or less.

7. The coated cutting tool according to claim 1, wherein the Ti compound layer is at least one selected from the group consisting of a TiN layer, a TiC layer, a TiCN layer, a TiCNO layer, a TiCO layer, a TiON layer, and a TiB$_2$ layer.

8. The coated cutting tool according to claim 1, wherein the substrate is a cemented carbide, a cermet, a ceramic, or a cubic boron nitride sintered body.

9. The coated cutting tool according to claim 2, wherein the skewness roughness ($S_{sk}$) is −3.0 or more and less than 0.

10. The coated cutting tool according to claim 2, wherein the first cross section satisfies a condition represented by following formula (1-1), $$RSA \geq 50 \quad (1-1)$$

in the formula, RSA is as defined in the formula (1).

11. The coated cutting tool according to claim 3, wherein the first cross section satisfies a condition represented by following formula (1-1), $$RSA \geq 50 \quad (1-1)$$

in the formula, RSA is as defined in the formula (1).

12. The coated cutting tool according to claim 9, wherein the first cross section satisfies a condition represented by following formula (1-1), $$RSA \geq 50 \quad (1-1)$$

in the formula, RSA is as defined in the formula (1).

13. The coated cutting tool according to claim 2, wherein the second cross section satisfies a condition represented by following formula (2-1), $$RSB \geq 50 \quad (2-1)$$

in the formula, RSB is as defined in the formula (2).

14. The coated cutting tool according to claim 3, wherein the second cross section satisfies a condition represented by following formula (2-1), $$RSB \geq 50 \quad (2-1)$$

in the formula, RSB is as defined in the formula (2).

15. The coated cutting tool according to claim 4, wherein the second cross section satisfies a condition represented by following formula (2-1), $$RSB \geq 50 \quad (2-1)$$

in the formula, RSB is as defined in the formula (2).

16. The coated cutting tool according to claim 9, wherein the second cross section satisfies a condition represented by following formula (2-1), $$RSB \geq 50 \quad (2-1)$$

in the formula, RSB is as defined in the formula (2).

17. The coated cutting tool according to claim 10, wherein the second cross section satisfies a condition represented by following formula (2-1), $$RSB \geq 50 \quad (2-1)$$

in the formula, RSB is as defined in the formula (2).

18. The coated cutting tool according to claim 11, wherein the second cross section satisfies a condition represented by following formula (2-1), $$RSB \geq 50 \quad (2-1)$$

in the formula, RSB is as defined in the formula (2).

19. The coated cutting tool according to claim 12, wherein the second cross section satisfies a condition represented by following formula (2-1), $$RSB \geq 50 \quad (2-1)$$

in the formula, RSB is as defined in the formula (2).

20. The coated cutting tool according to claim 2, wherein the average thickness of the entire coating layer is 8.0 μm or more and 30.0 μm or less.

* * * * *